United States Patent [19]
Yoshikawa et al.

[11] Patent Number: 5,717,249
[45] Date of Patent: Feb. 10, 1998

[54] RF POWER AMPLIFYING CIRCUIT DEVICE

[75] Inventors: Noriyuki Yoshikawa; Kazuki Tateoka; Akihisa Sugimura, all of Osaka; Kunihiko Kanazawa, Kyoto, all of Japan

[73] Assignee: Matsushita Electronics Corporation, Osaka, Japan

[21] Appl. No.: 627,656

[22] Filed: Apr. 4, 1996

[30] Foreign Application Priority Data

Apr. 5, 1995 [JP] Japan .................. 7-080154

[51] Int. Cl.⁶ .......... H01L 27/01; H01L 23/48; H01L 23/32
[52] U.S. Cl. .......... 257/728; 257/700; 257/702; 257/706; 257/723; 257/724; 257/532
[58] Field of Search ................. 257/700–702, 257/698, 692, 691, 690, 706, 723, 724–725, 531, 728, 729

[56] References Cited

U.S. PATENT DOCUMENTS

| | | | |
|---|---|---|---|
| 4,644,096 | 2/1987 | Gutierrez et al. | 361/405 |
| 4,849,284 | 7/1989 | Arthur et al. | 428/325 |
| 4,888,247 | 12/1989 | Zweben et al. | 428/105 |
| 5,200,810 | 4/1993 | Wojnarowski et al. | 257/668 |
| 5,371,405 | 12/1994 | Kagawa | 257/728 |
| 5,387,888 | 2/1995 | Eda et al. | 257/728 |
| 5,410,179 | 4/1995 | Komrumpf et al. | 257/730 |
| 5,426,405 | 6/1995 | Miller et al. | 257/726 |
| 5,559,363 | 9/1996 | Immorlica, Jr. et al. | 257/691 |

*Primary Examiner*—Minh-Loan Tran
*Assistant Examiner*—Alexander Oscar Williams
*Attorney, Agent, or Firm*—McDermott, Will & Emery

[57] ABSTRACT

A plurality of ceramic substrates are stacked in layers to form a multilayer structure. A semiconductor chip having an FET or the like is mounted on the uppermost first ceramic substrate to form an RF matching circuit. A ground layer is formed on the second ceramic substrate, i.e., in a middle layer, thereby preventing the interference of electric signals between circuit components mounted in the respective layers upper and lower than the ground layer. A bias circuit is formed on the top face of the third ceramic substrate, while a back-face ground electrode is formed on the back face of the third ceramic substrate. A leadless electrode is formed over the side faces of the respective ceramic substrates and the back face of the lowermost third ceramic substrate. By utilizing the high heat conductivity and proper dielectric constant of aluminum nitride, the overall RF power amplifying circuit device can be miniaturized at lower cost.

15 Claims, 5 Drawing Sheets

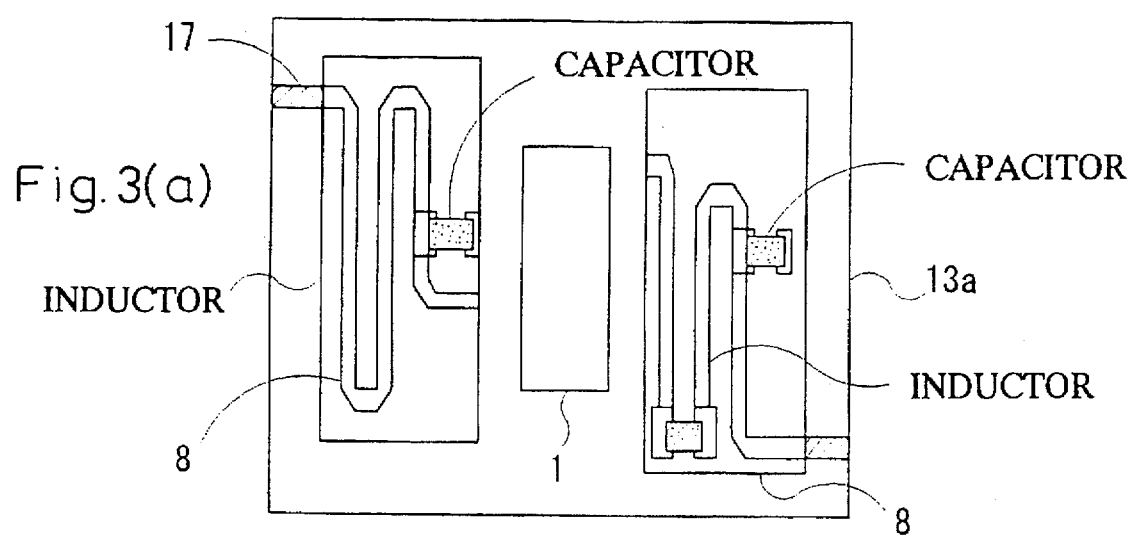
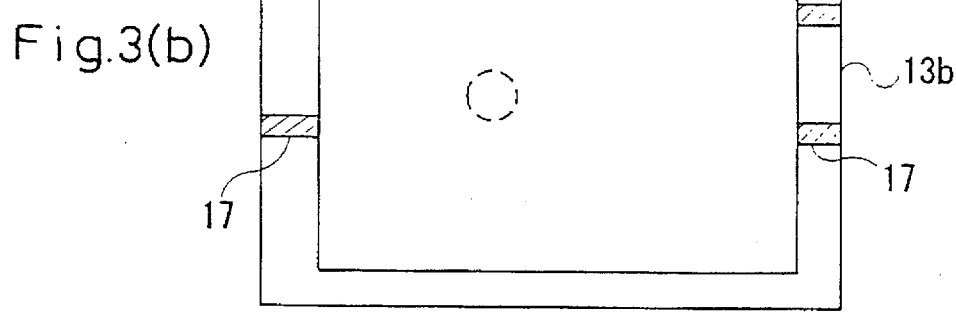
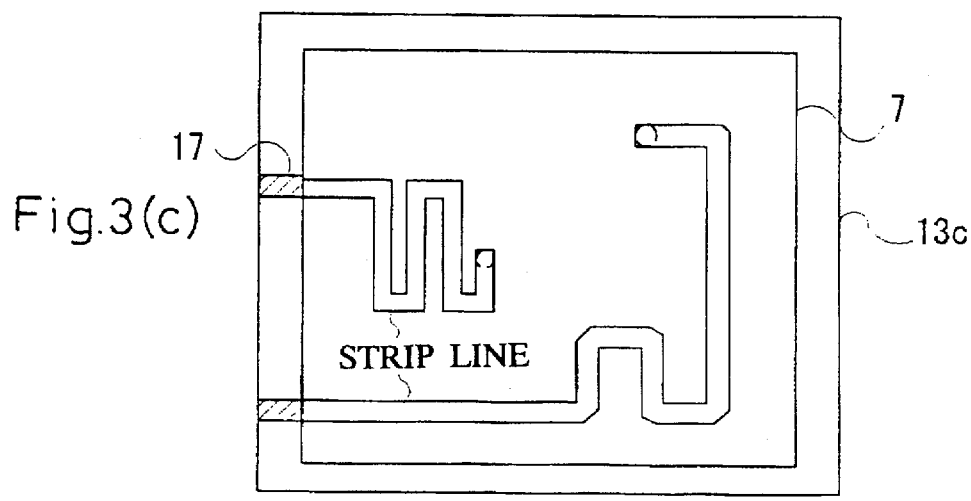

RF POWER AMPLIFYING CIRCUIT DEVICE

BACKGROUND OF THE INVENTION

The present invention relates to an RF power amplifying circuit device for use in radio systems such as mobile communication.

In recent years, compact and low-cost electronic circuit components have been in greater demand in mobile communication systems including a portable telephone and a car telephone. Conventional transmission circuits used in such mobile communication systems include RF power amplifying circuits in their final stages, which normally should be designed to dissipate heat generated therein to the outside because of their high power consumption. For this purpose, a typical conventional RF power amplifying circuit is so constructed that a semiconductor device with a semiconductor chip serving as a heating element packaged therein is mounted on a single-layer substrate of minimum thickness and the substrate is further formed with a hole for providing direct contact between the semiconductor device and a heat radiation plate.

Below, a description will be given to an example of a first conventional RF power amplifying circuit device with reference to FIG. 4. As shown in the drawing, an RF power amplifying circuit device A comprises a substrate 3 composed of a dielectric material such as ceramic, on which are mounted: two semiconductor devices 2 each containing a semiconductor device chip 1 composed of a compound semiconductor; a bias circuit 7; and an RF matching circuit 8 for matching impedances with respect to an RF signal. In each of the semiconductor devices 2, the semiconductor device chip 1 is die bonded, wire bonded, and then hermetically sealed in a package. Active components in each of the semiconductor device chips 1 and members in each of the circuits 7 and 8 are electrically connected to an external circuit through electrode leads 5 attached to a side of the substrate 3.

In such an RF power amplifying circuit device, a heat radiation plate 4 composed of copper tungsten (CuW) or the like and also serving as a metal shield plate is typically attached to the back face of the Substrate 3, so that heat generated in the RF power amplifying circuit, especially from the semiconductor device chips 1, is dissipated to the outside via the heat radiation plate 4 itself or a circuit board (not shown) attached to the back face of the heat radiation plate 4. In the case where the semiconductor device 2 generates an extremely large amount of heat, it is designed to be in intimate contact with the heat radiation plate 4 through a semiconductor-device mounting hole 6.

Next, a description will be given to an example of a second conventional RF power amplifying circuit device with reference to FIG. 5, which is a perspective view of an RF power amplifying circuit device B of MMIC (Microwave Monolithic Integrated Circuits) structure. As shown in the drawing, the RF power amplifying circuit device B is composed of an MMIC chip 9 which has been die bonded to the leadframes 12, wire bonded, and then hermetically sealed in a package 10. The MMIC chip 9 is composed of a high-cost compound semiconductor such as GaAs to provide a high-performance RF characteristic. In the MMIC chip 9, an active component region 11 and passive circuits such as a bias circuit 7 and an RF matching circuit 8 are integrated.

However, the above conventional RF power amplifying circuit devices have the following specific problems.

In the first RF power amplifying circuit device shown in FIG. 4, if the substrate 3 is assumedly composed of aluminum oxide, e.g., it is necessary to reduce the thickness of the substrate 3 to provide a sufficient amount of heat radiation since the semiconductor device chips 1 are contained in the packages and since the heat conductivity of aluminum oxide is as small as about 18 W/mK. In that case, it is difficult to implement a multilayer substrate in which a plurality of substrates 3 are stacked in layers to form a multilayer structure. As a result, the bias circuit 7 and the RF power matching circuit 8 are inevitably placed in two dimensions on the substrate 3, which increases the size of the circuit device.

If the amount of heat radiation from the semiconductor device 2 is to be increased, it is necessary to form the semiconductor-device mounting hole 6 in the substrate 3 to provide intimate contact between the semiconductor device 2 and the heat radiation plate 4, as shown in FIG. 4, resulting in an increased number of process steps and increased production cost. Furthermore, since it is necessary to form electrode leads 5 extracted from the substrate 3 in order to achieve electrical connection with the external circuits, the overall RF power amplifying circuit device A is increased in size and the area occupied by the mounted circuit components is considerably increased.

On the other hand, although the above second RF power amplifying circuit device shown in FIG. 5 can be extremely miniaturized since not only the active component region 11 but also the bias circuit 7 and RF matching circuit 8 are mounted on the compound semiconductor substrate, it is difficult to reduce cost because an increased amount of compound semiconductor is used therein. Specifically, the amount of compound semiconductor to be used becomes five to ten times larger than in the case where only the semiconductor chip 1 is composed of a compound semiconductor as shown in FIG. 4, so that the cost of the amplifying circuit device B is disadvantageously increased.

SUMMARY OF THE INVENTION

An object of the present invention, which has been achieved in view of the foregoing, is to provide a compact power amplifying circuit device that can be implemented at low cost with means for containing active components and circuit components in a small area, while a sufficient amount of heat radiation is provided.

The present invention is based on an RF power amplifying circuit device having a plurality of circuit components including a first active component for amplifying an RF signal and a plurality of passive components. The above RF power amplifying circuit device comprises: a multilayer structure consisting of a plurality of substrates composed of a dielectric material with a high heat conductivity and stacked in layers, wherein the above circuit components can be distributed in an uppermost layer corresponding to a region over a top face of the uppermost substrate, in at least one middle layer corresponding to a region lying between the substrates, in a lowermost layer corresponding to a region over a back face of the lowermost substrate, and in a side layer corresponding to a region over side faces of the above substrate; and a first semiconductor chip mounted on the top face of the above uppermost substrate and having the above first active component, the circuit components other than the above first active component being distributed in the individual layers of the above multilayer structure.

With the arrangement, integration degree is increased by distributing the circuit components in the individual layers of the multilayer structure, while the thermal resistance of the overall device is extremely reduced, since each substrate of the multilayer structure is composed of a dielectric material with a high heat conductivity. Consequently, the miniaturization of the entire device does not raise the temperature to such a level as may deteriorate reliability, so that excellent characteristics and reliability are provided.

There may be further provided a second semiconductor chip mounted on the uppermost substrate of the above multilayer structure, having a second active component, and composed of a semiconductor different from a semiconductor composing the above first semiconductor chip.

With the arrangement, it becomes possible to mount the first and second active components on the first semiconductor chip composed of a compound semiconductor and on the second semiconductor chip composed of silicon, respectively, or to mount the first and second active components on the first semiconductor chip composed of GaAs and on the second semiconductor chip composed of GaP. Consequently, the function of the RF power amplifying circuit device can be expanded.

The above first semiconductor chip is composed of a compound semiconductor, while there may be further provided a third semiconductor chip mounted in the uppermost layer of the above multilayer structure, having a third active component, and composed of silicon, the above third semiconductor chip being provided with the passive components included in the above circuit components.

In the arrangement, since the passive components are provided on the third semiconductor chip composed of low-cost silicon, the area occupied by the first semiconductor chip composed of a high-cost compound semiconductor can be reduced.

The above first semiconductor chip is composed of a compound semiconductor, the above circuit components include a stub composing an inductor or a distributed constant circuit, and the above first semiconductor chip is not provided with another stub composing an inductor or a distributed constant circuit and having a length equal to ⅛ of a wavelength of an RF signal on the above first semiconductor chip.

In the arrangement, although the semiconductor chip is composed of a high-cost compound semiconductor such as GaAs, a stub occupying a large area is formed on a low-cost aluminum nitride substrate, while another stub having a length equal to ⅛ of the wavelength of an RF signal, i.e., occupying a large area is not formed on the first semiconductor chip, so that the area occupied by the first semiconductor chip can be reduced. Consequently, the cost of the overall device can be reduced.

As the above circuit components, there may be provided an RF impedance matching circuit formed at least in the uppermost layer of the above multilayer structure.

With the arrangement, in the case where the RF impedance matching circuit occupying a large area is formed on the uppermost substrate, the circuit components can be distributed in three dimensions without adversely affecting the characteristics of the RF signal. On the other hand, in the case where slight degradation of characteristics may be tolerated, the RF impedance matching circuit may be disposed in the middle layer. Consequently, the area occupied by the first semiconductor chip and by the RF power amplifying circuit device can be reduced at lower cost.

There may be further provided a leadless electrode formed at least in the above side layer of the above multilayer structure to connect each of the circuit components to an external circuit.

In the arrangement, since the leadless electrode for connecting each of the circuit components in the multilayer structure to an external circuit disposed on a printed board or the like is formed on the side face of each substrate composing the multilayer structure, it is not necessary to provide the multilayer structure with an additional lead for achieving connection with the external circuit. Consequently, the capacity can be reduced by the portion occupied by the lead, so that the RF power amplifying circuit device can further be miniaturized.

As the above circuit components, there may be further provided two circuit components formed in two respective ones of the above uppermost, middle, and lowermost layers separated by at least one of the above uppermost, middle, and lowermost layers and a ground layer formed in the layer lying between the above two layers with the above two circuit components formed therein.

The arrangement prevents electric interference between the circuit components disposed in the respective layers upper and lower than the layer formed with the ground layer.

The above first semiconductor chip may be mounted on the above uppermost substrate by a flip-chip method with a face thereof provided with the above first active component facing the above uppermost substrate.

In the arrangement, since the semiconductor chip is mounted on the uppermost substrate by the flip-chip method, the wire-bonding step becomes unnecessary and the heat dissipating ability is improved since the active components including the FET serving as a heating element are in intimate contact with the substrate. Moreover, since the inductance component of the bonding wire is eliminated, the RF characteristic is also improved.

As the above circuit components, there may be further provided a filter circuit composed of at least two members formed in at least either one of the above uppermost and middle layers of the above multilayer structure.

With the arrangement, the integration degree of the circuit can be increased by forming the filter circuit in the three-dimensional multilayer structure. Additionally, the necessity for providing an additional filter circuit in the outside of the multilayer structure is eliminated, so that a filter for suppressing local leakage conventionally provided on the substrate of the equipment, e.g., becomes unnecessary, resulting in a cost reduction.

There may be further provided a back-face ground electrode formed in the above lowermost layer of the above multilayer structure and solder plated.

With the arrangement, the multilayer structure is solder bonded to the substrate of the equipment with intervention of the ground electrode provided on the back face of the lowermost substrate of the multilayer structure, so that the heat dissipating ability is improved and hence the necessity for providing an additional heat radiation plate or the like is eliminated. Consequently, the overall device can further be miniaturized at lower cost.

As the above circuit components, there may be provided a bias circuit formed in the above uppermost or middle layer of the above multilayer structure.

With the arrangement, since the three-dimensional structure incorporates the bias circuit accounting for a high proportion of the entire area occupied by the amplifying circuit, the RF power amplifying circuit device can be miniaturized by an increase in integration degree. Moreover, since the bias circuit is immune to the influence of characteristic variations, the overall circuit characteristics remain stable even when the bias circuit is formed in the middle layer of the multilayer structure.

At least one of the above plurality of substrates may be composed of aluminum nitride.

In the arrangement, since each substrate constituting the multilayer structure is composed of aluminum nitride having a proper relative dielectric constant of 8.8, the width of a pattern employed in forming the circuit components for use at a high radio frequency of 800 MHz or more can be reduced. However, the width of the pattern is not excessively reduced to such a degree as to adversely affect characteristic variations, resulting in an appropriate width of the pattern. Although the amount of generated heat is increased in an RF power amplifying circuit device requiring output power of 0.5 W or higher, the thermal resistance of the entire device becomes extremely small since the substrate is composed of aluminum nitride with an extremely high heat conductivity. Consequently, the overall device can be miniaturized to a greater extent.

At least one of the above plurality of substrates may be composed of aluminum oxide or silicon nitride.

With the arrangement, the multilayer structure can be composed of low-cost substrates in a low-power RF power amplifying circuit device.

At least any two of the above plurality of substrates may be composed of materials having different dielectric constants.

With the arrangement, the substrate with the circuit components including the ground layer not requiring a high dielectric constant disposed thereon can be composed of a low-cost material such as aluminum, silicon nitride, or glass ceramic, while the substrate with the circuit components requiring a high dielectric constant disposed thereon can be composed of a high-cost material such as aluminum nitride. Consequently, the materials of the substrates composing the multilayer structure can be determined by considering the function and cost of the RF power amplifying circuit device to be produced.

BRIEF DESCRIPTION OF THE DRAWINGS

FIG. 3 is a cross-sectional view showing an arrangement of an RF power amplifying circuit device according to a second embodiment;

DETAILED DESCRIPTION OF THE INVENTION (First Embodiment)

Figure 1A:
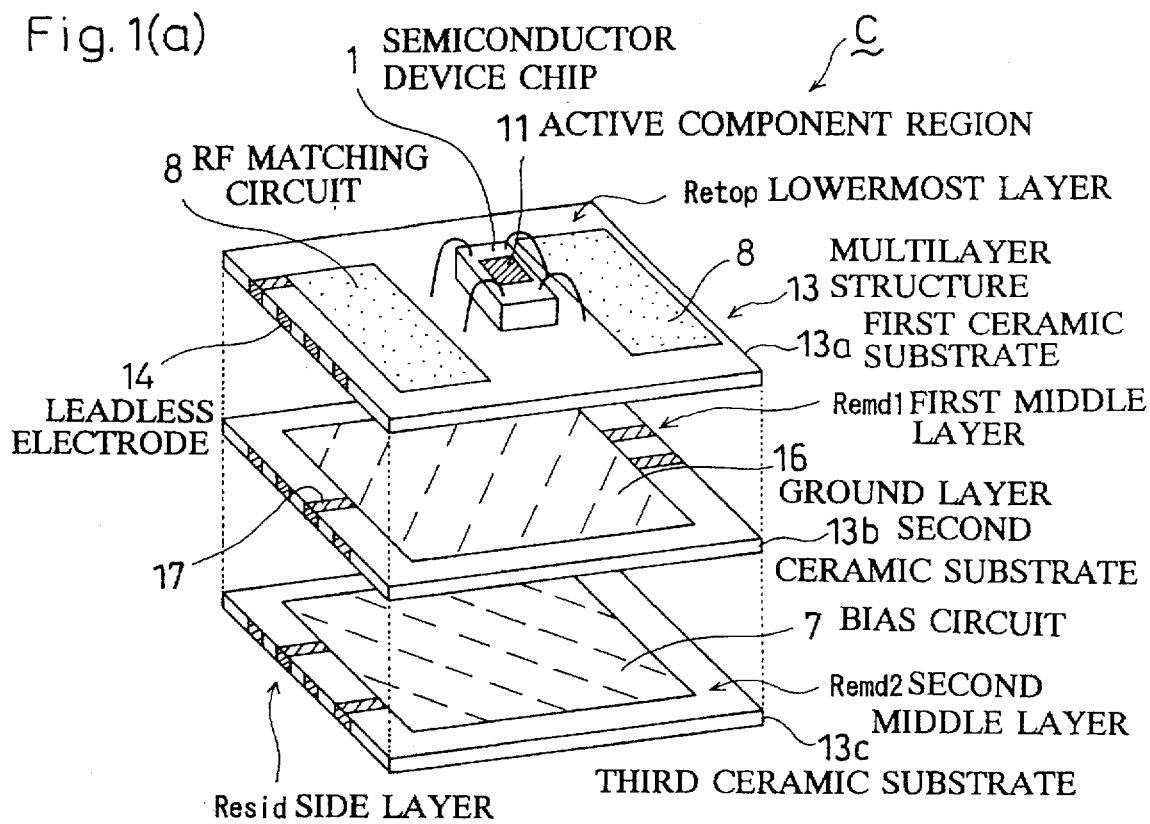
FIG. 1(a) is a perspective view showing an arrangement of an RF power amplifying circuit device according to a first embodiment and FIG. 1(b) is a plan view showing a back-face pattern of a third layer thereof.
Figure 1B:
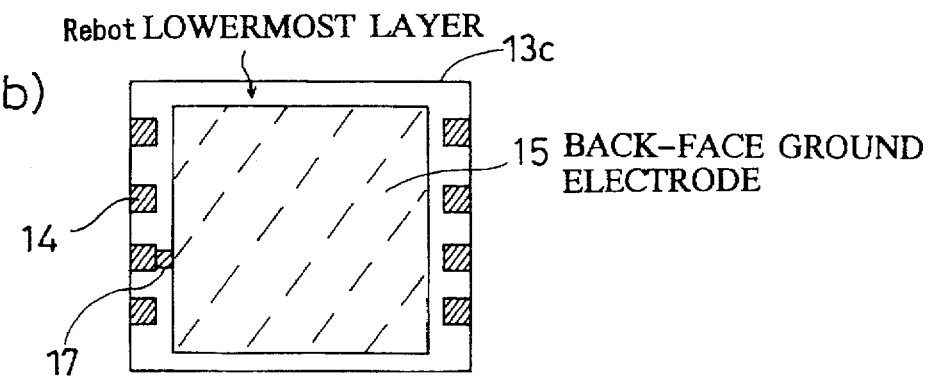

Initially, a first embodiment will be described with reference to FIGS. 1(a) and 1(b), of which FIG. 1(a) is a perspective view showing an arrangement of an RF power amplifying circuit device according to the present embodiment and FIG. 1(b) is a plan view of the back face of the lowermost substrate thereof.

As shown in FIG. 1(a), the RF power amplifying circuit device C comprises a multilayer structure consisting of first, second, and third ceramic substrates 13a, 13b, and 13c each composed of aluminum nitride. Although the three ceramic substrates 13a to 13c are shown separate from each other in the drawing, they are actually in intimate contact with each other. The multilayer structure 13 has: an uppermost layer Retop corresponding to the top face of the uppermost first ceramic substrate 13a; a lowermost layer Rebot corresponding to the back face of a lowermost third ceramic substrate 13c; a first middle layer Remd1 corresponding to a region lying between the first and second ceramic substrates 13a and 13b; a second middle layer Remd2 corresponding to a region lying between the second and third ceramic substrates 13b and 13c; and a side layer Resid corresponding to a region extending over the side faces of the first to third ceramic substrates 13a to 13c. Each of the layers Retop, Rebot, Remd1, Remd2, and Resid is constructed so that components are disposed therein.

A bare semiconductor device chip 1 composed of a compound semiconductor is mounted by die bonding and two RF matching circuits 8 are formed on the top face of the uppermost substrate 13a as the uppermost layer Retop of the multilayer structure 13. A ground layer 16 is formed on the top face of the second substrate 13b as the first middle layer Remd1. A bias circuit 7 is formed on the top face of the lowermost third substrate 13c as the second middle layer Remd2. As shown in FIG. 1(b), a back-face ground electrode 15 is formed on the back face of the third substrate 13c as the lowermost layer Rebot. The back-face ground electrode 15 has been solder plated. Leadless electrodes 14 are formed on the side faces of the individual ceramic substrates 13a to 13c as the side layer Resid through the printing of a metal paste. The leadless electrodes 14 extend to the back face of the third ceramic substrate 13c to form back-face electrodes 14. The leadless electrodes 14 are connected by connectors 17 to the components in the semiconductor chip 1, to the individual circuits 7 and 8, and to the electrodes 15 and 16 so that each of the members in the circuit device is connected to an external circuit.

Figure 2:
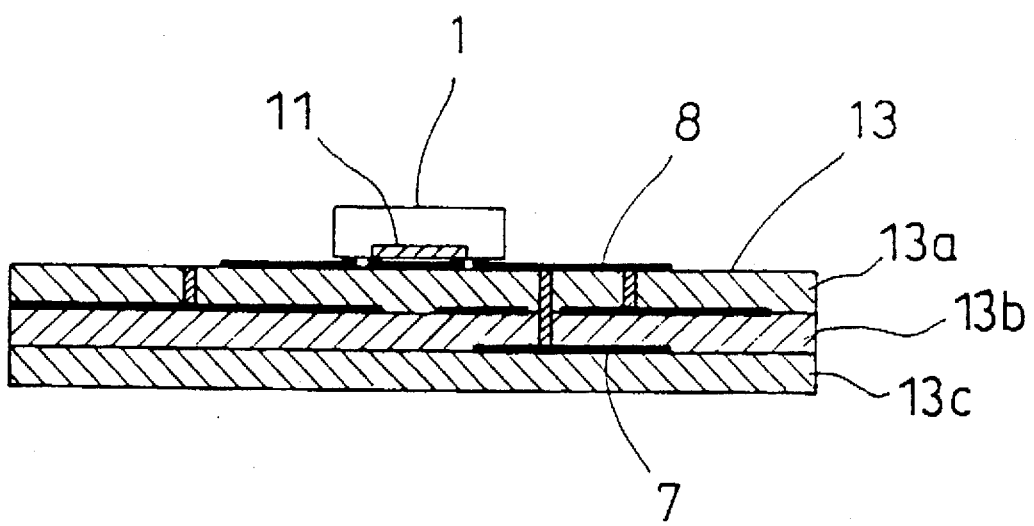
FIG. 2 is a plan view diagrammatically showing respective arrangements on the top faces of individual substrates composing a multilayer structure according to the first embodiment.
Figure 4:
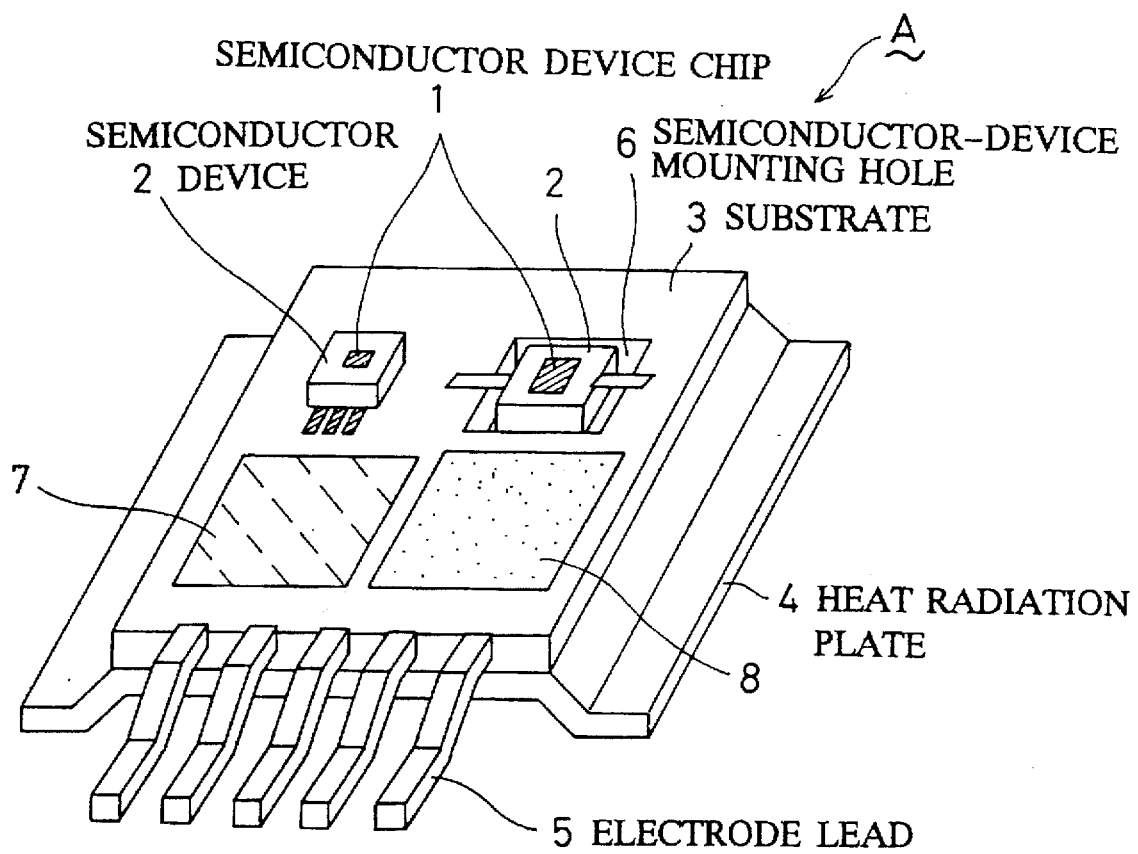
FIG. 4 is a perspective view showing an arrangement of a first conventional RF power amplifying circuit device.

FIGS. 2(a) to 2(c) are plan views schematically showing respective arrangements of the RF matching circuit 8 formed on the first ceramic substrate 13a, ground layer 16 formed on the second ceramic substrate 13b, and bias circuit 7 formed on the third ceramic substrate 13c. As shown in FIG. 2(a), the RF matching circuit 8 is composed of an inductor and a capacitor. As shown in FIG. 2(c), the bias circuit 7 is composed of a microstrip line having a length equal to ¼ of a wavelength.

The present embodiment provides the following advantages due to the arrangements described below.

(1)

Aluminum nitride (AlN) which is a material composing the multilayer structure 13 has a high heat conductivity of about 150 W/mK. The value of the heat conductivity is substantially comparable to the heat conductivity of copper tungsten (CuW) which is a metal used to compose a conventional heat radiation plate.

Since the ground electrode 15 occupying a large area is solder plated, it occupies a large area when soldered onto the substrate of the equipment (not shown) so that it has an excellent heat dissipating ability.

Moreover, since the bare semiconductor device chip 1 is bonded directly to the ceramic substrate 13a, it is possible to omit the step of hermetically sealing the semiconductor device chip 1, thereby providing an excellent heat dissipating property.

Since the heat dissipating ability of the entire RF power amplifying circuit device C is thus improved, it is unnecessary to provide an additional heat radiation plate, resulting in device miniaturization at lower cost.

(2)

In an RF power amplifying circuit device at a frequency of 800 MHz or higher, it is inevitable to provide an RF matching circuit composed of an inductor and a capacitor to reduce a loss and obtain a high gain. To achieve a high power applying efficiency, on the other hand, it is inevitable to provide a DC bias circuit 7 having a high impedance at a used frequency and a low DC impedance. However, if such circuit components as the RF matching circuit 8 and the bias circuit 7 are disposed in two dimensions on a single substrate, they occupy a large area corresponding to about 80% or more of the entire area in the RF power amplifying circuit. By contrast, if the circuit components are three-dimensionally distributed in the individual layers of the multilayer structure 13 as shown in the present embodiment, it becomes possible to miniaturize the entire RF power amplifying circuit device C, while providing a sufficient area for the circuit components.

Since the bias circuit 7 is particularly immune to the influence of characteristic variations, it does not impair the stability of the overall circuit characteristics even if it is provided in the middle layer Remd1 or Remd2. Consequently, the provision of the bias circuit 7 in the middle layer Remd1 and Remd2 provides a remarkable effect of achieving the miniaturization of the RF power amplifying circuit device C without impairing the characteristics thereof.

(3)

In the case where the RF matching circuit 8 is disposed in the middle layer Remd1 or Remd2, a slight characteristic change may be caused by the presence of a through hole, a difference in film thickness, and variations in dielectric constant. The foregoing slight characteristic change can be prevented by disposing the RF matching circuit 8 on the top face of the first substrate 13a, i.e., in the uppermost layer Retop. Although the characteristic variations of a matching circuit in an RF power amplifying circuit device normally used in a frequency range of 100 MHz or more may seriously affect the characteristics of the entire circuit, an extremely stable characteristic can be obtained with the provision of the RF matching circuit 8 in the uppermost layer Retop of the multilayer structure 13.

(4)

In the case where the RF matching circuit 8 is formed in the uppermost layer Retop, an RF power amplifying circuit having various characteristics can be implemented by positively adjusting the circuit constant of the RF matching circuit 8 by such a technique as trimming.

(5)

Figure 5:
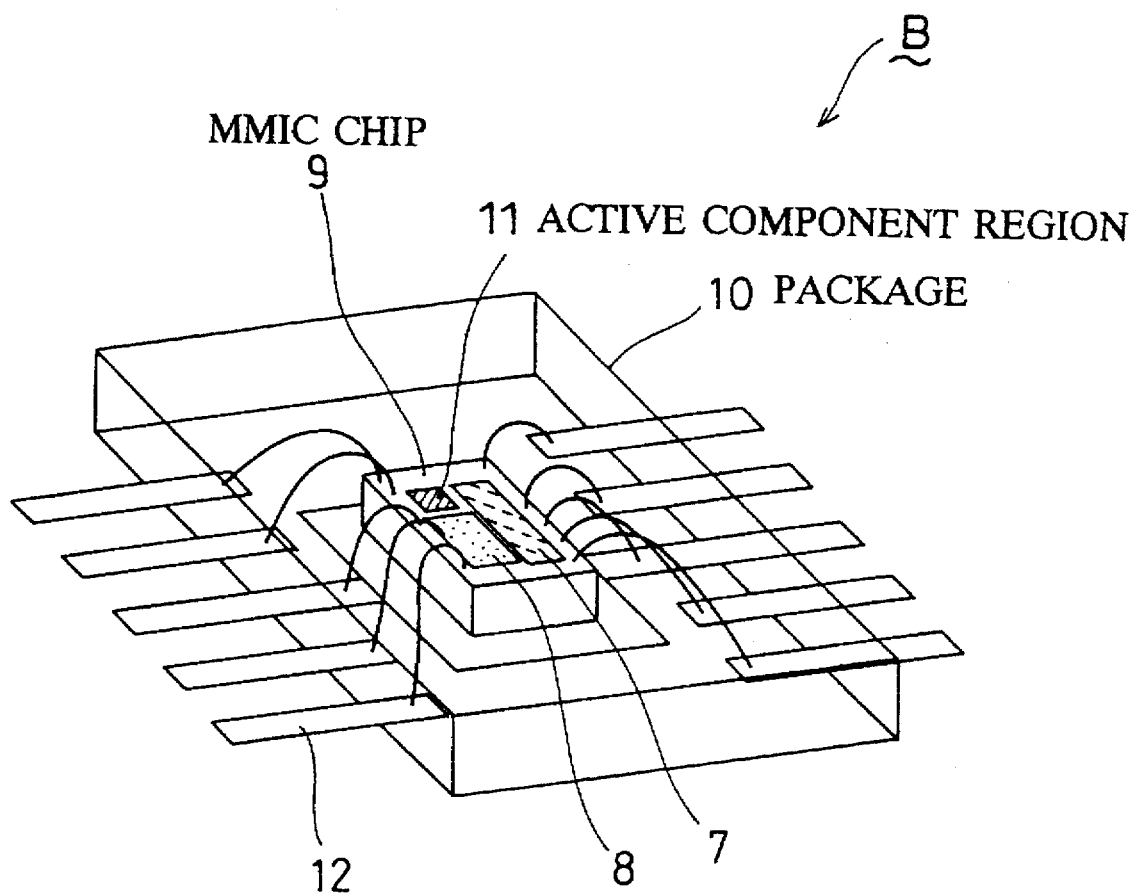
FIG. 5 is a perspective view showing an arrangement of an MMIC as a second conventional RF power amplifying circuit device.

In the above MMIC which is the second conventional RF power amplifying circuit device shown in FIG. 5, it is difficult to reduce the area occupied by the high-cost compound semiconductor substrate since the RF circuit components are formed thereon. In the present embodiment, by contrast, the circuit components other than the FET as the active component are distributed in the individual layers of the multilayer structure 13. Although interconnect lines each having a length equal to 1/8 of the wavelength in an RF circuit acquire characteristics as a circuit component and occupy a larger area, since the interconnect lines can also be distributed in the individual layers of the multilayer structure 13, the chip size of the compound semiconductor substrate can be reduced to about 1/10 of that of the conventional MMIC, thereby achieving a remarkable cost reduction.

(6)

Since the ground layer 16 is provided in the first middle layer Remd1 of the multilayer structure 13, i.e., on the top face of the second substrate 13b, it becomes possible to prevent electrical interference between the individual circuit components distributed in the respective layers upper and lower than the ground layer 16. Specifically, electrical interference can be prevented between the RF matching circuit 8 and FET disposed in the uppermost layer Retop of the multilayer structure 13 and the bias circuit 7 disposed in the second middle layer Remd2.

(7)

The back face of the third substrate 13c is formed with the back-face ground electrode 15 which has been solder plated as described above and with the back-face electrodes 141 partially composing the leadless electrodes 14. By thus forming the leadless electrodes extending over the side faces of the ceramic substrates 13a to 13c and the back face of the third substrate 13c, the capacity conventionally occupied by the lead portion can be reduced, which reduces the overall capacity to about 1/3 of that of the conventional power amplifying circuit of hybrid structure in combination with the effect of the three-dimensional multilayer structure 13.

(8)

Moreover, even when the back-face electrode 141 formed on the back face of the third substrate 13c is solder bonded by reflow onto the substrate of the equipment (not shown), excellent solder bonding properties can be obtained.

(9)

Furthermore, since the RF power amplifying circuit device is completed by simply adding a metal cover to the arrangement shown in FIGS. 1(a) and 1(b), an RF power amplifying circuit device suitable for practical use can be composed of a simple structure.

Next, a description will be given to the miniaturization of the RF power amplifying circuit device with their excellent properties retained by composing the ceramic substrates 13a to 13c of aluminum nitride as in the present embodiment.

Since a substrate composed of aluminum nitride has an excellent heat dissipating ability, it can exert a remarkable effect particularly when used in an RF power amplifying circuit generating a large amount of heat of about 0.5 W or more. A specific description will be given to the case where a GaAs chip 1 mm square and about 150 µm thick is mounted on the ceramic substrate 1 mm thick, which is in turn mounted on a printed board 3 cm square. The thermal resistance of the GaAs chip is about 15° C./W, while the thermal resistance of the printed board is about 40° C./W. The thermal resistance of the ceramic substrate composed of alumina is about 70° C./W, while the thermal resistance of the ceramic substrate composed of aluminum nitride is about 9° C./W. The overall thermal resistance when the alumina substrate is used as the ceramic substrate is about 125° C./W, while the overall thermal resistance when the aluminum nitride substrate is used as the ceramic substrate is about 64° C./W. If the RF power amplifying circuit device with the thermal resistance of about 64° C./W is used as a power amplifier producing a 0.5 W output, the power of 0.75 W is consumed as heat when the efficiency is about 40%. Consequently, in an environment at 60° C., the temperature of the joint of the FET reaches about 154° C. when the alumina substrate is used in the RF power amplifying circuit device, while the temperature of the joint of the FET can be suppressed to 110° C., when the aluminum nitride substrate is used in the RF power amplifying circuit device.

By thus using the multilayer structure 13 consisting of the aluminum nitride substrates 13a to 13c stacked in layers in the power amplifying circuit producing the output power of 0.5 W or more, the temperature of the joint of the FET can be suppressed to 150° C. or lower, so that reliability which renders the RF power amplifying circuit device suitable for practical use is provided, while device miniaturization is achieved at lower cost.

If one of an alumina substrate, a silicon nitride substrate, a low-temperature sintered glass ceramic substrate and the like, each of which is low in heat conductivity and cost, is used in a power amplifying circuit producing a small output to form the structure as shown in FIGS. 1(a) and 1(b), reliability which renders the RF power amplifying circuit device suitable for practical use is provided, while device miniaturization is achieved at lower cost.

Alternatively, if the first ceramic substrate 13a with circuit components generating a large amount of heat mounted thereon is composed of aluminum nitride and the second and third ceramic substrates 13b and 13c with circuit components generating a small amount of heat mounted thereon are composed of aluminum oxide, silicon nitride, or the like, a cost reduction and proper heat-dissipating characteristics can be implemented.

In the arrangement of the present embodiment, the high relative dielectric constant of 8.8 of aluminum nitride enables the miniaturization of circuit components including the transmission line of the RF matching circuit used in an RF range of about 800 MHz or higher. With a relative dielectric constant higher than 8.8, however, a line width for obtaining a specified characteristic impedance becomes excessively small so that variations in the line width of a pattern formed by printing or like technique have an enhanced influence on the characteristic impedance, which may expand the range of characteristic variations to about several tens of percent or more. Hence, it may be concluded that aluminum nitride is a material suitable for use in a microwave circuit since it has a high heat conductivity as well as a high relative dielectric constant.

Although the present embodiment has described an example of the basic RF power amplifying circuit device comprising the RF matching circuit 8, the bias circuit 7, and the semiconductor device chip 1, a higher-performance RF power amplifying circuit device of filter-incorporated type may be implemented if a filter is formed in the multilayer structure by utilizing the plurality of substrates composing the multilayer structure. For example, an LC filter composed of a parallel-plate capacitor can easily be implemented by utilizing the inductance and multilayer structure of the wiring pattern. With the incorporated filter, it becomes possible to omit the mounting of an additional filter for suppressing local leakage on the substrate of the equipment.

Of the circuit components, a passive component may be mounted directly in each of the layers composing the multilayer structure 13 as in the present embodiment or otherwise may be formed on a semiconductor substrate composed of low-cost silicon or like material so that the semiconductor substrate is mounted in, i.e., the uppermost layer Retop. In this case also, the number of passive components formed on the semiconductor device chip 1 composed of a compound semiconductor can be minimized, so that the size of the semiconductor device chip 1 composed of a high-cost compound is minimized. Consequently, a cost reduction is achieved and the passive component formed on the silicon substrate can be miniaturized.

With the simultaneous mounting of two or more semiconductor device chips composed of the same or different semiconductor materials in the multilayer structure 13, a plurality of active components of different characteristics can be provided, thereby providing a multi-functional RF power amplifying circuit device. For example, a compound semiconductor substrate may be combined with a silicon substrate or a GaAs substrate may be combined with a GaP substrate.

Although the multilayer structure 13 consists of the three ceramic substrates 13a to 13c stacked in layers in the present embodiment, it will be appreciated that the multilayer structure may consist of four or more ceramic substrates stacked in layers as required.

Although aluminum nitride is used as the material of the ceramic substrates 13a to 13c composing the multilayer structure 13 in the present embodiment, a similar construction may be implemented and a similar effect may be achieved if another dielectric material such as aluminum oxide, silicon nitride, or low-temperature sintered glass ceramic is used instead to compose the substrates provided that it has a sufficiently high heat conductivity and a sufficiently large relative dielectric constant.

Although the RF matching circuit 8 is provided in the uppermost layer Retop of the multilayer structure 13 to properly satisfy the matching conditions for the RF matching circuit 8 in the present embodiment, the RF power amplifying circuit device can further be miniaturized by mounting a part or the whole of the RF matching circuit 8 in the middle layers Remd1 and Remd2 if the permissible range of the matching conditions are sufficiently wide.

(Second Embodiment)

Next, a second embodiment will be described with reference to FIG. 3.

FIG. 3 is a cross-sectional view of an RF power amplifying circuit device in the second embodiment. As shown in the drawing, the multilayer structure 13 of the present embodiment consists of three ceramic substrates 13a to 13c, an RF matching circuit 8 is formed on the top face of the first ceramic substrate 13a, and a bias circuit 7 is formed on the top face of the third ceramic substrate 13c, i.e., in a second middle layer Remd2, similarly to the above first embodiment.

The present embodiment is characterized in that a semiconductor device chip 1 is mounted on the first substrate 13a of the multilayer structure 13 by a flip-chip method. In other words, a pad on the semiconductor device chip 1 is connected directly to a pad on the multilayer structure 13 formed through patterning via a bump without using wire bonding.

In the present embodiment, the step of wire bonding can be omitted with the structure implemented by the flip-chip method and more excellent heat-dissipating property can be provided since an active component region 11 of the semiconductor device chip 1 is in intimate contact with the multilayer structure 13.

Moreover, since the inductance component intrinsic to a bonding wire can be removed, a gain can be improved in terms of the RF characteristic.

We claim:

1. An RF power amplifying circuit device having a plurality of circuit components including a first active component for amplifying an RF signal and a plurality of passive components, said RF power amplifying circuit device comprising:

a multilayer structure consisting of a plurality of substrates composed of a dielectric material with a high heat conductivity and stacked in layers, wherein said circuit components can be distributed,
  in an uppermost layer corresponding to a region over a top face of the uppermost substrate,
  in at least one middle layer corresponding to a region lying between the substrates,
  in a lowermost layer corresponding to a region over a back face of the lowermost substrate, and
  in a side layer corresponding to a region over side faces of said substrates; and
a first semiconductor chip mounted on the top face of said uppermost substrate and having said first active component,
wherein the circuit components, other than said first active component, are distributed in the individual layers of said multilayer structure.

2. An RF power amplifying circuit device according to claim 1,
  wherein said first semiconductor chip is composed of a semiconductor, and further comprising,
  a second semiconductor chip mounted on the uppermost substrate of said multilayer structure,
  said second semiconductor chip having a second active component, and
  wherein said second semiconductor is composed of a semiconductor different from the semiconductor composing said first semiconductor chip.

3. An RF power amplifying circuit device according to claim 1,
  wherein said first semiconductor chip is composed of a compound semiconductor, and
  wherein said RF power amplifying circuit device further comprises,
  a third semiconductor chip mounted in the uppermost layer of said multilayer structure, having a third active component, and composed of silicon, said third semiconductor chip being provided with the passive components included in said circuit components.

4. An RF power amplifying circuit device according to claim 1,
  wherein said first semiconductor chip is composed of a compound semiconductor,
  wherein said circuit components include a stub composing an inductor or a distributed constant circuit, and
  wherein said first semiconductor chip is not provided with another stub comprising an inductor or a distributed constant circuit and having a length equal to ⅛ of a wavelength of an RF signal on said first semiconductor chip.

5. An RF power amplifying circuit device according to claim 1,
  wherein said circuit components include an RF impedance matching circuit formed at least in the uppermost layer of said multilayer structure.

6. An RF power amplifying circuit device according to claim 1, further comprising,
  a leadless electrode formed at least in said side layer of said multilayer structure to connect each of the circuit components to an external circuit.

7. An RF power amplifying circuit device according to claim 1,
  wherein said circuit components include,
  two circuit components formed in two respective ones of said uppermost, middle, and lowermost layers separated by at least one of said uppermost, middle, and lowermost layers, and
  a ground layer formed in the layer lying between said two layers with said two circuit components formed therein.

8. An RF power amplifying circuit device according to claim 1,
  wherein said first semiconductor chip is mounted on said uppermost substrate by a flip-chip method so that said first semiconductor chip is connected directly on said uppermost substrate.

9. An RF power amplifying circuit device according to claim 1,
  wherein said circuit components include a filter circuit composed of at least two members formed in at least either one of said uppermost and middle layers of said multilayer structure.

10. An RF power amplifying circuit device according to claim 1, further comprising,
  a back-face ground electrode formed in said lowermost layer of said multilayer structure and solder plated.

11. An RF power amplifying circuit device according to claim 1,
  wherein said circuit components include a bias circuit formed in a layer of said multilayer structure other than said lowermost layer.

12. An RF power amplifying circuit device according to claim 1,
  wherein at least one of said plurality of substrates is composed of aluminum nitride.

13. An RF power amplifying circuit device according to claim 1,
  wherein at least one of said plurality of substrates is composed of aluminum oxide.

14. An RF power amplifying circuit device according to claim 1,
  wherein at least any two of said plurality of substrates are composed of materials having different dielectric constants.

15. An RF power amplifying circuit device according to claim 1,
  wherein at least one of said plurality of substrates is composed of silicon nitride.

* * * * *